United States Patent
Huang

(10) Patent No.: US 6,373,102 B1
(45) Date of Patent: Apr. 16, 2002

(54) PROCESS FOR FABRICATING A CHANNEL REGION OF A TRANSISTOR DEVICE WITH ION IMPLANTATION AND THE TRANSISTOR DEVICE FORMED THEREFROM

(75) Inventor: Chih-Yao Huang, Hsinchu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/433,782

(22) Filed: Nov. 3, 1999

(30) Foreign Application Priority Data

Sep. 6, 1999 (TW) .......................... 88115317

(51) Int. Cl.⁷ ............................. H01L 29/76
(52) U.S. Cl. ................ 257/345; 257/285; 257/286; 257/287; 257/327; 257/335; 257/344; 257/345; 438/289; 438/290; 438/291
(58) Field of Search ................. 257/285, 286, 257/344, 345, 287, 327, 335; 438/289, 290, 291

(56) References Cited

U.S. PATENT DOCUMENTS 5,557,129 A * 9/1996 Oda et al. .................. 257/345
6,031,268 A * 11/2000 Hiroki et al. ............... 257/345
6,147,383 A * 11/2000 Kuroda ....................... 257/344
6,153,910 A * 11/2000 Oda et al. ................... 257/345
6,177,705 B1 * 1/2001 Tyagi et al. ................ 257/345

* cited by examiner

Primary Examiner—Eddie Lee
Assistant Examiner—Edgardo Ortiz
(74) Attorney, Agent, or Firm—Beyer Weaver & Thomas LLP

(57) ABSTRACT

The invention is related to a method for fabricating a channel region of a transistor device by ion implantation with a large angle and the transistor device formed therefrom. The transistor device is formed on a substrate. Furthermore, the ion implantation with a large angle forms the channel of the transistor in order to prevent the punchthrough phenomenon between the source region and the drain region. In addition, the profile of the channel region is compact and non-uniform. Therefore the ion concentration is higher in the middle of the channel region than in the other regions. Thus, the parasitic capacitance and the junction leakage can be reduced. The carrier mobility is higher than that of the prior art. Moreover, the threshold voltage is more easily controlled than that of the prior art.

4 Claims, 4 Drawing Sheets

PROCESS FOR FABRICATING A CHANNEL REGION OF A TRANSISTOR DEVICE WITH ION IMPLANTATION AND THE TRANSISTOR DEVICE FORMED THEREFROM

BACKGROUND OF THE INVENTION

1. Field of the Invention

The present invention relates to a transistor device, and more particularly to a method for fabricating a channel region of a transistor device utilizing ion implantation and the transistor device formed therefrom.

2. Description of the Related Art

FIG. 1 schematically illustrates a conventional MOS transistor; in particular, an anti-punchthrough region is formed by ion implantation with a large angle.

As shown in FIG. 1, the transistor is formed on a P-type silicon substrate 10. A source region S and a drain region D are included in the silicon substrate 10. Upon the surface of the silicon substrate 10 are sequentially formed a gate oxide layer 16 and a gate G. Insulating spacers 12 are formed on the side-walls of the gate G. Further, p-type anti-punchthrough regions 14 are formed by ion implantation with a large angle to reduce the short channel effect and punchthrough phenomenon.

However, there are many disadvantages of forming the anti-punchthrough regions 14 by ion implantation with a large angle. First, the profile of the anti-punchthrough regions 14 is dispersed and incompact in practical processes. Second, the junction capacitance between the anti-punchthrough regions 14, the source region S and the drain region D is increased. Third, the junction leakage between the anti-punchthrough regions 14, the source region S and the drain region D is also increased. The disadvantages described above will affect the working conditions of the transistor device.

SUMMARY OF THE INVENTION

Accordingly, an object of the present invention is to provide a method for fabricating a transistor device with a specific channel region so that the threshold voltage of the device is controlled better. In order to reduce the short channel effect and the punchthrough phenomenon, an anti-punchthrough region is formed by ion implantation with a predetermined angle. Furthermore, ions are implanted into a substrate in a single step. Implanting ions into a substrate in a single step can reduce masking and photolithography processes, thereby saving costs. The profile of the anti-punchthrough region is non-uniform, which is different from the prior technology, i.e., the dispersed and incompact profile.

Another object of the present invention is to provide a transistor device with a specific channel region. The specific channel region is formed by implanting ions into a substrate in a single step so that the profile of the specific channel region is compact and non-uniform. Further, the ion concentration between the channel region and the source or the drain region is lower so that the parasitic capacitance and the junction leakage are lower than that of the prior art. Accordingly, the performance of the device is improved.

To attain the first object of the present invention, an on implantation with a large angle is provided to form a transistor device with a specific channel region. The formation of the device comprises the following steps. First, a semiconductor substrate is provided, then a gate is formed on the semiconductor substrate. Subsequently, ions are implanted into the semiconductor substrate below the gate with a large angle in a single step to form a channel region with a non-uniform profile. The channel region is used to reduce the punchthrough phenomenon of the device. This results in the channel region better controlling the threshold voltage. Then, source and drain regions of the device are formed in the substrate adjacent to the channel regions.

To attain the second object of the present invention, a transistor device with a specific channel region is provided, wherein ions implanted into a substrate with a large angle form the specific channel region. The structure of the device comprises: a semiconductor substrate upon which a gate is formed; a channel region with non-uniform profile formed by ion implantation with a large angle in a single step to reduce the punchthrough phenomenon and control the threshold voltage; and a source region and a drain region arranged in the substrate below the gate.

BRIEF DESCRIPTION OF THE DRAWINGS

These and other features of the present invention will now be described in detail with reference to the accompanying drawings, in which.

DETAILED DESCRIPTION OF THE PREFERRED EMBODIMENT

Figure 1:
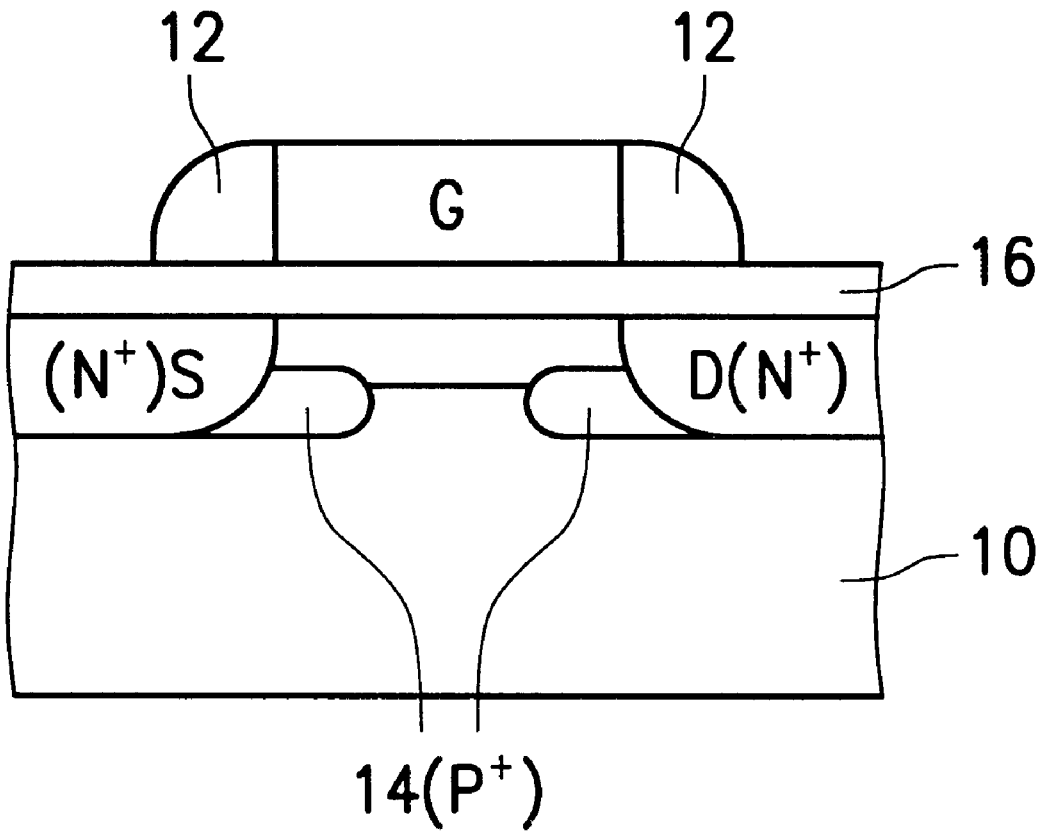
FIG. 1 shows the conventional cross-section of a transistor device with anti-punchthrough regions formed by ion implantation with a large angle.
Figure 2A:
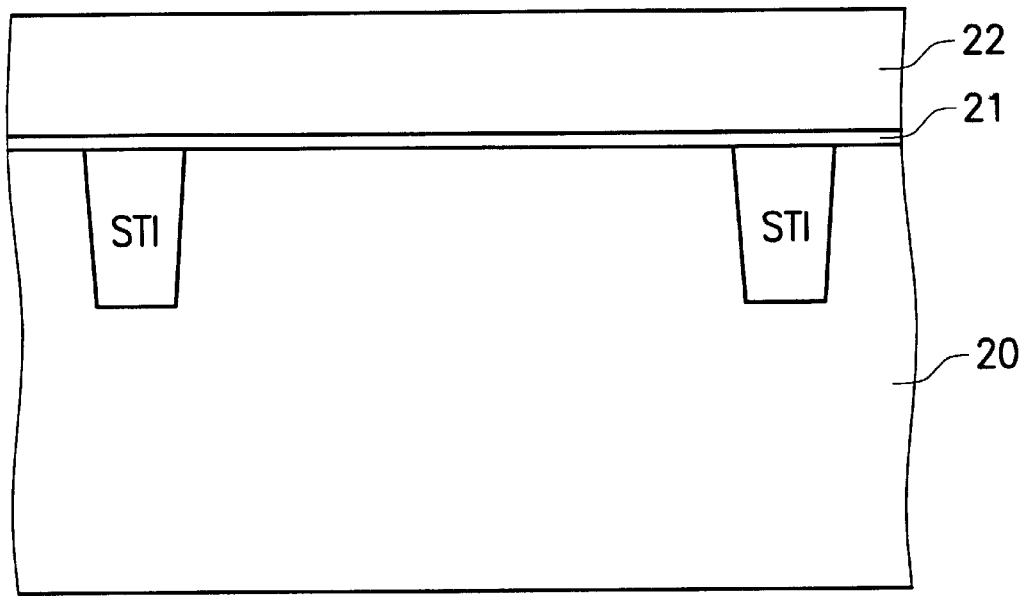
FIGS. 2A~2F show cross-sectional views of fabricating a specific channel region of a transistor device utilizing large angle ion implantation according to the present invention.

Please refer to FIG. 2A, wherein a semiconductor substrate is provided. For example, a silicon substrate 20 is used in this embodiment. Inside the silicon substrate 20 are a plurality of shallow trench isolations STI used to isolate active areas. In this embodiment, the silicon substrate 20 is doped with P-type ions such as Boron to form an NMOS transistor. However, it is to be understood that doping N-type ions in the silicon substrate 20 can also form a PMOS transistor if desired. Thereafter, an oxide layer (for example, a silicon dioxide layer 21) is formed on the silicon substrate 20. Then a conducting layer (for example, a polycrystalline silicon layer 22) is formed on the silicon dioxide layer 21.

Figure 2B:
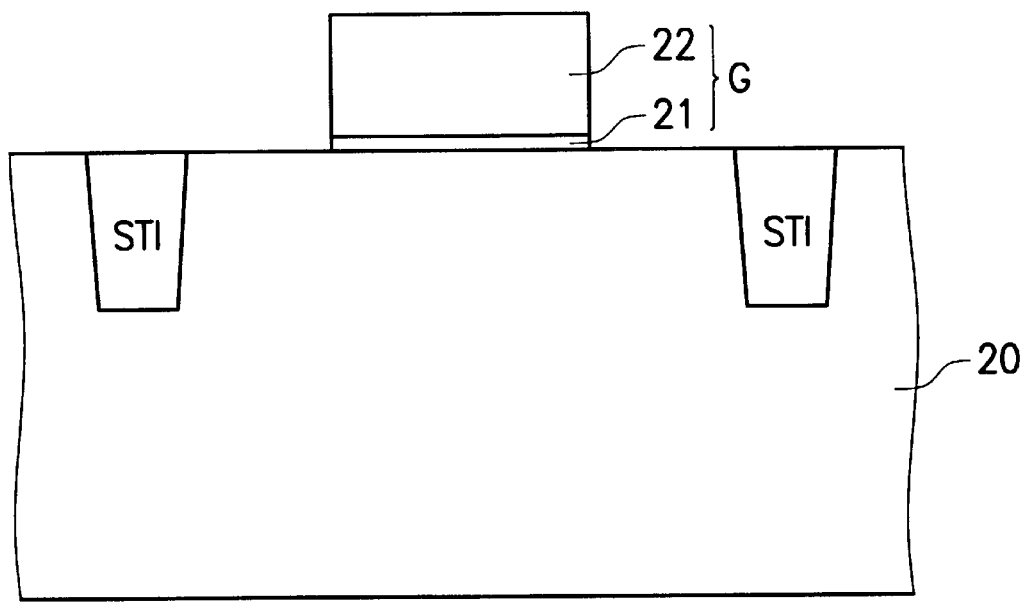

Next, please refer to FIG. 2B, which illustrates the step of defining the gate on the semiconductor substrate. For example, a gate G is defined utilizing photolithography and etching processes. The gate G includes a gate oxide layer (e.g. the silicon dioxide layer 21), and a gate electrode (e.g. the polycrystalline silicon layer 22).

Figure 2C:
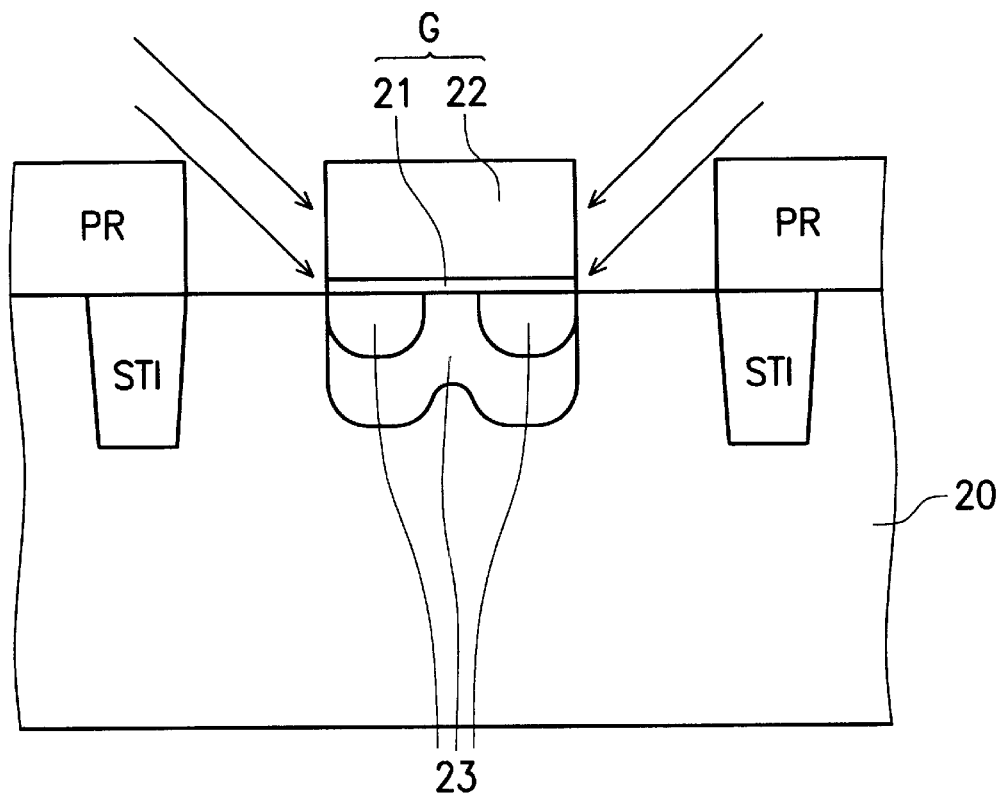

Then a channel region is formed by implanting ions in a single step into the substrate below the gate electrode. Further, the ions are implanted into the substrate with a large angle. Referring to FIG. 2C, a patterning photoresist layer PR is coated on the surface of the silicon substrate 20. The thickness of the photoresist resist layer PR is about 2000~10000 $\mu$m after counting. Subsequently, ions(for example, Boron ions) are implanted into the silicon substrate 20, wherein the implanting angle is about 70° and the ion concentration is about $10^{12}$~$5\times10^{13}$ atoms/cm². Because the ion implantation energy is high, (for example, 45~60 Kev), some of the ions collide with the lattice atoms and move upward by backscattering. A channel region 23 with three different concentrations is then formed according to FIG. 2C. It is noted that to form a channel region according to the method of the present invention, only one step is needed. Thus, the number of processes (for example, masking and photolithography) and the cots can be reduced. On the other hand, the present invention utilizes ion implantation with a large angle so that the variables of the environment, (for example, heights of surrounding devices, the angle of ion implantation, or the energy of ion implantation) must be considered and matched with each other.

Figure 2D:
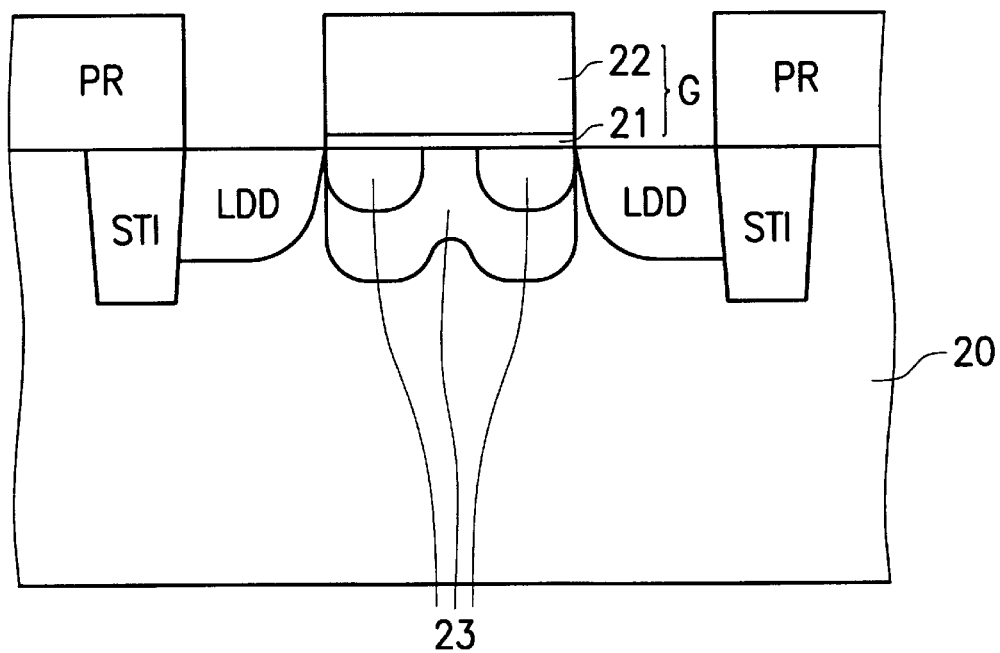
Figure 2E:
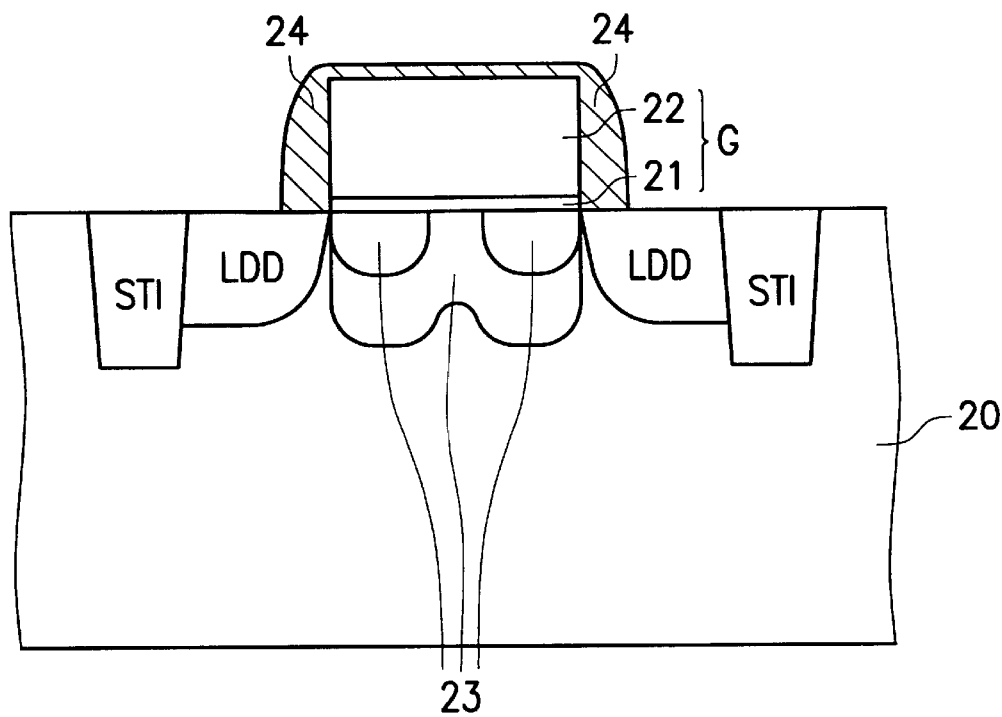

Then the source region and the drain region of the transistor are formed adjacent to the channel region. Please refer to FIG. 2D. Taking the gate G and the photoresist layer PR as masks, then N-type ions (for example, phosphorous ions) are doped into the silicon substrate 20 adjacent to the channel region 23, forming lightly doped drain (LDD) region of the transistor device. Thereafter, please refer to FIG. 2E, wherein the photoresist layer PR is removed. An insulating layer (for example, boro-phospho-silicate-glass layer, e.g. BPSG layer) is deposited on the surface of the silicon substrate 20 (not shown). Then the BPSG layer (not shown) is etched back to form insulating spacers 24 on the side-walls of the gate G. Now refer to FIG. 2F. Taking the gate G, the insulating spacers 24, and the shallow trench isolations STI as masks, N-type ions (for example, Arsenic ions) having high concentration are doped into the LDD regions. Thus, source region S and drain region D of the transistor device are formed.

An important feature of the method for fabricating a channel region of a MOS transistor of the present invention is implanting ions with large angle into a proper position of a substrate in a single step to form a channel region. As only one step of implanting ions into the semiconductor substrate is needed in the present invention, photolithography and masking processes can be reduced, thereby saving costs. Thus, the present invention is advantageous in the manufacturing of semiconductor devices.

Figure 2F:
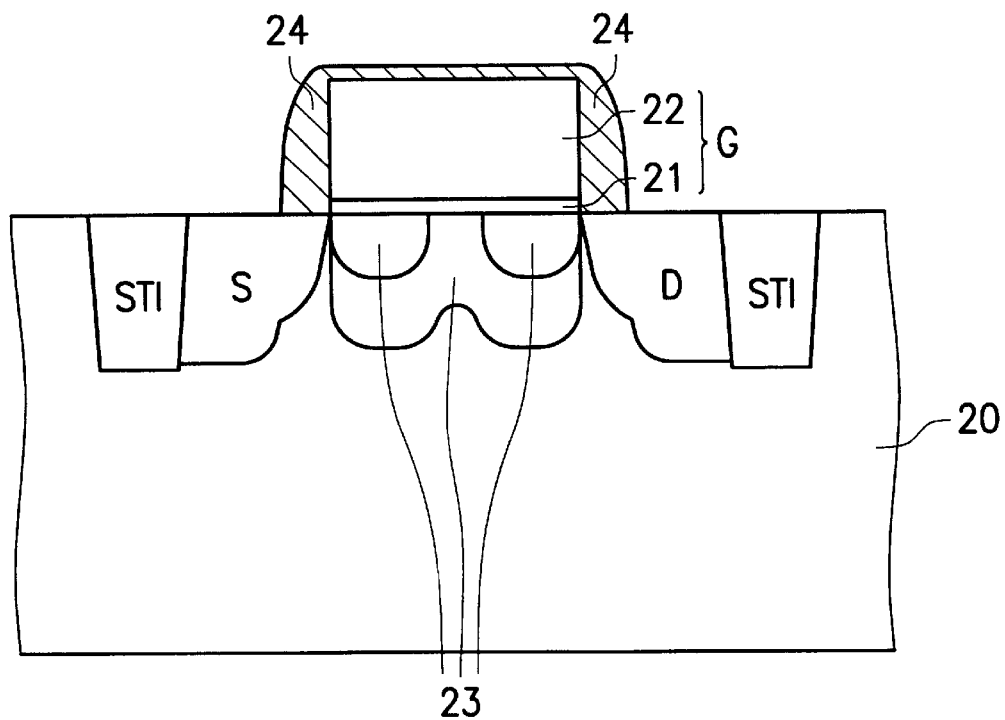

As shown in FIG. 2F, the transistor device according to the present invention is formed on a silicon substrate 20. The structure of the transistor device mainly comprises a gate G, insulating spacers 24, a channel region 23, a source region S and a drain region D. The gate includes a gate oxide layer, (for example, silicon dioxide layer 21), and a gate electrode, (for example, polycrystalline silicon layer 22). The material of the insulating spacers 24 is BPSG. The channel region 23 is formed in the silicon substrate 20 below the gate G. Furthermore, the channel region 23 is formed by implanting ions into the silicon substrate 20 with a large angle in a single step. The source region S and the drain region D are formed in the silicon substrate 20 adjacent to the channel region 23.

The features of the device of the present invention stem from the formation of the channel region of the transistor. The profile of the channel region is compact. As the ion concentration in the middle of the channel is higher, the parasitic capacitance between the channel region and the source region (or the drain region) of the present invention is lower than that of the prior art. Also, the ion concentration in the contact region between the channel region and the source region (or the drain region) of the present invention is lower than that of the prior art, so the junction leakage is reduced. Furthermore, a channel region with non-uniform profile prevents the implanted ions from diffusing. Therefore the threshold voltage of the MOS transistor device can be more easily controlled. Additionally, the mobility of the carriers can be increased.

While the present invention has been described and illustrated herein with reference to the preferred embodiment thereof, it will be understood by those skilled in the art that various changes in the form and details may be made therein without departing from the spirit and the scope of the invention.

What is claimed is:

1. A transistor device with a specific compact non-uniform channel region formed by ion implantation on a semiconductor substrate, comprising:

a gate formed on the surface of the semiconductor substrate;

a channel region formed in the semiconductor substrate below the gate that includes at least a first group and a second group of ion implanted material each of which has a non-uniform, double-hump doping profile formed in a lateral direction across the channel region, wherein the double-hump doping profile of the first group extends through the channel region just below the gate such that the double-hump doping profile is positioned symmetrically about a center of a bottom portion of the gate, wherein the second group encloses the first group by extending deeper into the substrate, such that the double-hump doping profile of the second group substantially conforms in shape to the double-hump doping profile of the first group, and wherein a second doping concentration of the double-hump doping profile of the second group is lighter than a second doping concentration of the double-hump doping profile of the first group; and a source region and a drain region formed in the semiconductor substrate adjacent to the channel region.

2. The transistor device as claimed in claim 1, wherein the channel region is 0.08 to 0.2 $\mu$m below the surface of semiconductor substrate.

3. The transistor device as claimed in claim 1, wherein the semiconductor substrate is a silicon substrate.

4. The transistor device as claimed in claim 1, wherein the material of the gate is polycrystalline silicon.

* * * * *